US012362677B2

(12) United States Patent
Yan et al.

(10) Patent No.: US 12,362,677 B2
(45) Date of Patent: Jul. 15, 2025

(54) POWER CONVERSION DEVICE AND INTEGRATED MACHINE

(71) Applicant: Sungrow Power Supply Co., Ltd., Hefei (CN)

(72) Inventors: Longxiang Yan, Hefei (CN); Qiyao Zhu, Hefei (CN); Xiaohu Wang, Hefei (CN); Xianwei Zhang, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 238 days.

(21) Appl. No.: 18/108,152

(22) Filed: Feb. 10, 2023

(65) Prior Publication Data

US 2023/0291323 A1 Sep. 14, 2023

(30) Foreign Application Priority Data

Mar. 14, 2022 (CN) .......................... 202220566537.4

(51) Int. Cl.
*H05K 7/14* (2006.01)
*H02J 3/38* (2006.01)
*H02M 7/00* (2006.01)

(52) U.S. Cl.
CPC ............. *H02M 7/003* (2013.01); *H02J 3/381* (2013.01); *H05K 7/14325* (2022.08); *H02J 2300/24* (2020.01)

(58) Field of Classification Search
CPC .......... H05K 7/14; H05K 7/1492; H02B 1/30; H02B 1/301; H02B 1/305; H02B 1/306; H02B 1/38
USPC .................................................. 361/622–623
See application file for complete search history.

(56) References Cited

U.S. PATENT DOCUMENTS

| 10,298,018 | B2 * | 5/2019 | Moriyama | H02J 1/102 |
| 10,396,554 | B2 * | 8/2019 | Chik | H02J 3/00 |
| 10,483,765 | B2 * | 11/2019 | Pedersen | H01F 27/24 |
| 10,840,704 | B2 * | 11/2020 | Shuai | H02J 3/02 |
| 11,148,531 | B2 * | 10/2021 | Brauner | B60L 1/006 |
| 11,336,171 | B2 * | 5/2022 | Poveda Lerma | H02M 7/5395 |
| 11,420,575 | B2 * | 8/2022 | Rapp | H02J 1/10 |
| 11,451,052 | B2 * | 9/2022 | Au | H02S 40/38 |
| 11,725,622 | B1 * | 8/2023 | Wilson | H02J 3/48 |
| | | | | 60/497 |

(Continued)

FOREIGN PATENT DOCUMENTS

| CN | 209088317 U | 7/2019 |
| CN | 209571706 U | 11/2019 |
| CN | 210380669 U | 4/2020 |

OTHER PUBLICATIONS

Extended European Search Report for European Application No. 23154680.5, dated Jul. 20, 2023.

*Primary Examiner* — Adrian S Wilson
(74) *Attorney, Agent, or Firm* — Wolf, Greenfield & Sacks, P.C.

(57) ABSTRACT

A power conversion device and an integrated machine are provided, The power conversion device includes a housing and a power converter. The power converter is arranged in the housing, and two ends, opposite to each other, of the power converter are respectively provided with a direct current wiring area and an alternate current wiring area. Two ends of the housing corresponding to the direct current wiring area and the alternate current wiring area each is provided with a movable door being capable of being opened and closed.

8 Claims, 3 Drawing Sheets

(56) References Cited

U.S. PATENT DOCUMENTS

2014/0247539 A1  9/2014  Valencic et al.
2018/0097452 A1  4/2018  Chapman et al.

* cited by examiner

POWER CONVERSION DEVICE AND INTEGRATED MACHINE

This disclosure claims the priority to Chinese Patent Application No. 202220566537.4, titled "POWER CONVERSION DEVICE AND INTEGRATED MACHINE", filed with the China National Intellectual Property Administration on Mar. 14, 2022, the entire disclosure of which is incorporated herein by reference.

FIELD

The present disclosure relates to the field of electronic device, in particular to a power conversion device and an integrated machine.

BACKGROUND

With the development of photovoltaic industry, electrical devices used for power conversion, such as photovoltaic inverters and energy storage converters, progress rapidly.

The photovoltaic inverters and the energy storage converters are respectively responsible for power conversion functions of direct current to alternate current and alternate current to direct current. The layout of an alternate current side and a direct current side of the electrical device directly affects the whole layout and system scheme of machine, as well as the convenience and experience of field wiring at a client device. The realization of reasonable layout and system scheme is an object in the industry.

SUMMARY

An object of the present disclosure is to provide a power conversion device and an integrated machine, to improve the convenience of field wiring, maintenance and overhaul of the power conversion device.

In order to achieve the above object, a power conversion device is provided according to the present disclosure. The power conversion device includes a housing and a power converter.

The power converter is arranged in the housing, where two ends, opposite to each other, of the power converter are respectively provided with a direct current wiring area and an alternate current wiring area.

Two ends of the housing corresponding to the direct current wiring area and the alternate current wiring area each is provided with a movable door being capable of being opened and closed.

In some embodiments, the movable door is rotatably connected with the housing; or, the movable door is slidably connected with the housing; or, the movable door is detachably connected with the housing.

In some embodiments, the power converter has a length direction, and the direct current wiring area and the alternate current wiring area are respectively arranged at two ends of the power converter in the length direction.

In some embodiments, a side wall of the housing is provided with a first threading hole for threading a wire connected with the alternate current wiring area; and/or, a bottom of the housing is provided with a second threading hole for threading a wire connected with the alternate current wiring area.

In the above technical solutions, the direct current wiring area and the alternate current wiring area of the power converter are arranged opposite to each other, which facilitates a maintainer to perform field wiring. In addition, two ends, corresponding to the direct current wiring area and the alternate current wiring area, of the housing of the power conversion device each is provided with a movable door being capable of being opened and closed, which facilitates the maintainer to perform field maintenance and overhaul.

To achieve the above object, an integrated machine is provided according to the present disclosure. The integrated machine includes a transformation device and the foregoing power conversion device.

The power conversion device is electrically connected with the transformer device through the alternate current wiring area, and a side wall of the power conversion device faces the transformer device.

In some embodiments, there are at least two power conversion devices. The alternate current wiring area of the power conversion device, adjacent to the transformer device, of the at least two power conversion devices is connected in parallel with the transformer device, and the alternate current wiring areas of two adjacent power conversion devices are connected in parallel with each other.

In some embodiments, the at least two power conversion devices are arranged at a same side of the transformer device, and the alternate current wiring areas of the at least two power conversion devices are arranged in a same plane.

In some embodiments, the at least two power conversion devices are arranged at different sides of the transformer device, and the alternate current wiring areas of power conversion devices arranged at a same side of the transformer device are arranged in a same plane.

In some embodiments, the at least two power conversion devices are arranged at two opposite sides of the transformer device. The alternate current wiring area of the power conversion device arranged at one side of the transformer device is arranged in a first plane, and the alternate current wiring area of the power conversion device arranged at the other side of the transformer device is arranged in a second plane, where the first plane and the second plane are coincident or in parallel.

In some embodiments, quantities of the power conversion devices arranged at the two opposite sides of the transformer device are equal to each other.

In the above technical solutions, for the layout of the integrated machine, since the side wall of the power conversion device faces the transformer device and the power conversion device is maintained at the ends of the power conversion device, multiple power conversion devices can be arranged adjacent to each other and the power conversion devices and the transformer device can be arranged adjacent to each other, and a maintenance operation is performed at two ends of the power conversion device. In this way, it not only facilitates the field wiring, maintenance and overhaul by the maintainer, but also reduces an overall floor area of the integrated machine, and reduces the cost of foundation construction. The power configuration of the integrated machine is relatively flexible, and the quantity of the power conversion devices can be increased according to actual requirements.

BRIEF DESCRIPTION OF THE DRAWINGS

In order to explain the technical solutions in the embodiments of the present disclosure or in the conventional technology, the drawings used in the description of the technical solutions in the embodiments or the conventional technology will be introduced briefly hereinafter. It is apparent that, the drawings in the following description are only some embodiments of the present disclosure. Other draw

DESCRIPTION OF REFERENCE NUMERALS

| Numeral | Name |
|---|---|
| 100 | integrated machine |
| 10 | power converter device |
| 11 | housing |
| 111 | movable door |
| 12 | power converter |
| 121 | direct current wiring area |
| 122 | alternate current wiring area |
| 20 | transformer device |

The implementation, functional features and advantages of the present disclosure will be further described with reference to the drawings in combination with the embodiments.

Detailed Description of the Embodiments

The technical solutions in the embodiments of the present disclosure will be described hereinafter in combination with the drawings in the embodiments of the present disclosure. It is apparent that the described embodiments are only a part of the embodiments according to the present disclosure, rather than all of the embodiments. All other embodiments obtained by those skilled in the art without creative efforts based on the embodiments of the present disclosure shall fall within the protection scope of the present disclosure.

It should be noted that all directional indications (such as up, down, left, right, front, back) in the embodiments of the present disclosure are only used to explain movement or relative position relationship between components under a specific posture (as shown in the figure). If the specific posture changes, the directional indications change accordingly.

In addition, in the present disclosure, the description involving "first", "second", or the like are only used for descriptive purposes, and cannot be understood as indicating or implying the relative importance or implicitly indicating the number of indicated technical features. Therefore, the features defined with "first", "second" or the like may include at least one of the features explicitly or implicitly. In addition, the technical solutions between the various embodiments can be combined with each other, but they must be based on the realization by those skilled in the art. When the combination of technical solutions is contradictory or cannot be realized, it should be considered that such a combination of technical solutions does not exist, and is not within the protection scope of the present disclosure.

A power conversion device 10 is provided according to an embodiment of the present disclosure.

Figure 1:
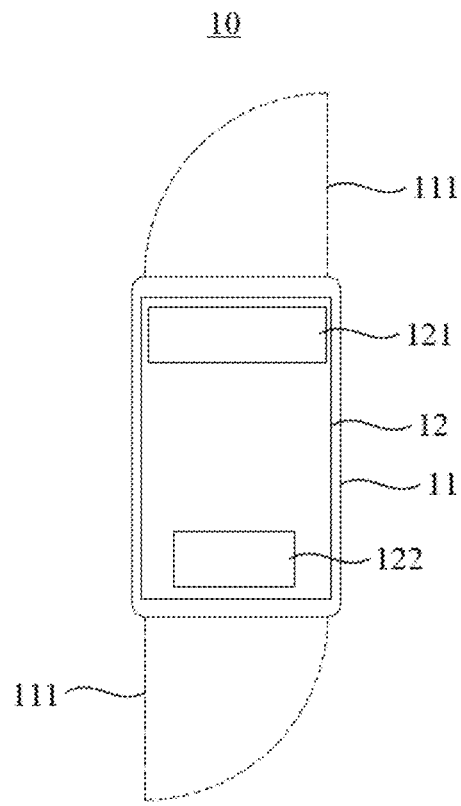
- FIG. 1 is a schematic structural diagram of a power conversion device according to an embodiment of the present disclosure.

In the embodiment of the present disclosure, as shown in FIG. 1, the power conversion device 10 includes a housing 11 and a power converter 12. The power converter 12 is arranged in the housing 11, and two ends, opposite to each other, of the power converter 12 are respectively provided with a direct current wiring area 121 and an alternate current wiring area 122. Two ends, corresponding to the direct current wiring area 121 and the alternate current wiring area 122, of the housing 11 each is provided with a movable door 111 being capable of being opened and closed.

In the present embodiment, the power conversion device 10 may be an inverter or a converter for realizing power conversion functions of direct current to alternate current or alternate current to direct current. The power conversion device 10 may be used in the photovoltaic field. The power conversion device 10 is connected to a photovoltaic module through the direct current wiring area 121, and the power conversion device 10 is connected to a transformation device 20 through the alternate current wiring area 122 and then connected to the power grid. In a case that the power conversion device 10 is the inverter, when operating, the photovoltaic module converts the solar energy into direct current power and transmits the direct current power to the inverter (power conversion device 10). The inverter (power conversion device 10) converts the direct current power into an alternate current voltage. The alternate current voltage is boosted by the transformer device 20, and the boosted voltage is finally output to the power grid to achieve power supply. The power conversion device 10 is also referred to as a low-voltage electrical device (usually in a unit of hectovolt), and the transformer device 20 is also referred to as a medium voltage device (usually in a unit of kilovolt).

In the technical solution according to the present embodiment, the direct current wiring area 121 and the alternate current wiring area 122 of the power converter 12 are arranged in the opposite direction. That is, one of the direct current wiring area 121 and the alternate current wiring area 122 is arranged at a front end of the power converter 12, and the other is arranged at a back end of the power converter 12, which facilitates the field wiring by the maintainer. In addition, two ends, corresponding to the direct current wiring area 121 and the alternate current wiring area 122, of the housing 11 of the power conversion device 10 each is provided with a movable door 111 that can be opened and closed. When the maintainer needs to perform maintenance and overhaul on the power conversion device 10, the movable door 111 may be opened to expose the power converter 12. When the maintainer completes the maintenance and overhaul, the movable door 111 may be closed to close the housing 11 so as to protect the power converter 12. Therefore, the movable door 111 can facilitate field maintenance and overhaul by the maintainer.

In some embodiments, referring to FIG. 1, the movable door 111 is rotatably connected with the housing 11. Alternatively, the movable door 111 is slidably connected with the housing 11. Alternatively, the movable door 111 is detachably connected with the housing 11.

In some embodiments, one side of the movable door 111 is hinged with the housing 11 through an articulated seat, and the movable door 111 may rotate with respect to the housing 11 based on the articulated seat to realize opening and closing. For another example, slide rails are arranged at two sides of the housing 11 corresponding to the movable door 111, and the movable door 111 slides against the housing 11 through the slide rails to realize opening and closing. For another example, the movable door 111 is provided with a snap, and the housing 11 is correspondingly provided with a snap hole. The movable door 111 and the housing 11 are detachably connected through the cooperation between the snap and the snap hole. In the embodiment, the movable door 111 and the housing 11 may be movably connected in many manners, which is not limited in the present disclosure.

Optionally, referring to FIG. 1, the power converter 12 has a length direction, and the direct current wiring area 121 and the alternate current wiring area 122 are respectively arranged at two ends of the power converter 12 in the length direction.

It is to be understood that in order to facilitate the maintenance and overhaul of the power conversion device 10, a maintenance space is to be reserved at a corresponding side of the direct current wiring area 121 and the alternate current wiring area 122. In the present embodiment, the direct current wiring area 121 and the alternate current wiring area 122 are arranged along the length direction of the power conversion device 10, so that in a case that multiple power conversion devices 10 are connected with the transformer device 20, the multiple power conversion devices 10 may be arranged side by side. That is, long sides of the power conversion devices 10 are adjacent to each other, and maintenance is performed at short sides of the power conversion devices 10. In this way, the overall floor area of the device can be reduced, thereby reducing the cost of base foundations.

In some embodiments, a side wall of the housing 11 is provided with a first threading hole for threading a wire connected with the alternate current wiring area 122; and/or, a bottom of the housing 11 is provided with a second threading hole for threading a wire connected with the alternate current wiring area 122.

In the embodiment, in a case that multiple power conversion devices 10 are arranged side by side, multiple power conversion devices 10 are connected in parallel and currents of the multiple power conversion devices 10 are converged and then connected to the transformer device 20. Specifically, alternate current wiring areas 122 of two adjacent power conversion devices 10 are connected through a wire, and the wire may thread out through the first threading hole on the side wall of the power conversion device 10 or the second threading hole on the bottom of the power conversion device 10, and thus the wiring operation is convenient.

An integrated machine 100 is provided according to an embodiment of the present disclosure. The integrated machine 100 includes a transformation device 20 and a power conversion device 10. The specific structure of the power conversion device 10 may be referred to the above embodiments. Since the integrated machine 100 adopts the technical solutions of all the above embodiments, the integrated machine 100 at least has all the advantageous effects of the technical solutions of the above embodiments, which will not be described here. The power conversion device 10 is electrically connected with the transformer device 20 through the alternate current wiring area 122, and a side wall of the power conversion device 10 faces the transformer device 20.

In the embodiment, since a longitudinal side of the power conversion device 10 faces the transformer device 20, and the power conversion device 10 is maintained at transverse end of the power conversion device 10, multiple power conversion devices 10 can be arranged adjacent to each other and the power conversion devices 10 and the transformer device 20 can be arranged adjacent to each other, and a maintenance operation can be performed at two ends of the power conversion device 10. In this way, it not only facilitates the field wiring, maintenance and overhaul by the maintainer, but also reduces an overall floor area of the integrated machine 100 and reduces the cost of foundation construction. The power configuration of the integrated machine 100 is relatively flexible, and the quantity of the power conversion devices 10 can be increased according to actual requirements.

In an embodiment, referring to FIGS. 2 to 5, the quantity of the power conversion device 10 is at least two. An alternate current wiring area 122 of the power conversion device adjacent to the transformer device 20 is connected in parallel with the transformer device 20, and alternate current wiring areas 122 of two adjacent power conversion devices 10 are connected in parallel with each other.

In some embodiments, each low-voltage electrical device is designed in a module, that is, each low-voltage electrical device is a low-voltage module, and multiple low-voltage modules are arranged in parallel side by side and adjacent to each other. Modular low-voltage electrical devices can be flexibly matched to be designed as an integrated machine 100 meeting different power levels. In some embodiments, each integrated machine 100 includes at least two low-voltage modules, and alternate current wiring areas of the low-voltage modules are electrically connected in parallel to be current-converged and then are connected to a low-voltage side of a medium voltage device.

Figure 2:
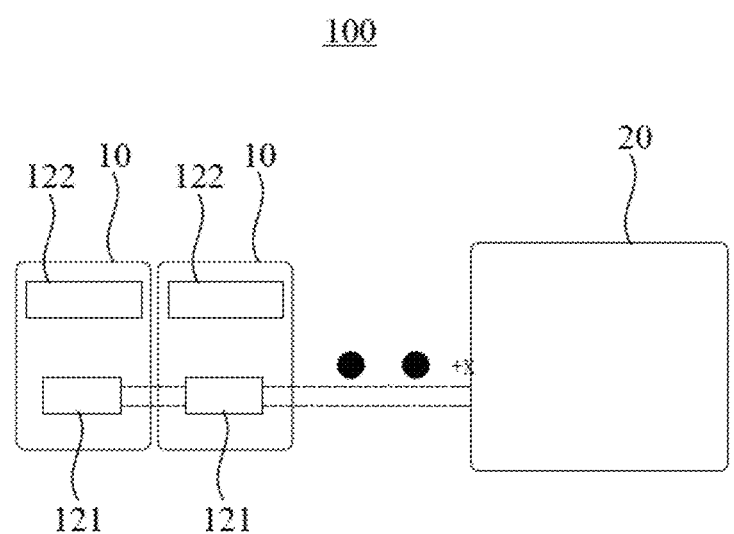
FIG. 2 is a schematic structural diagram of an integrated machine according to an embodiment of the present disclosure.
Figure 3:
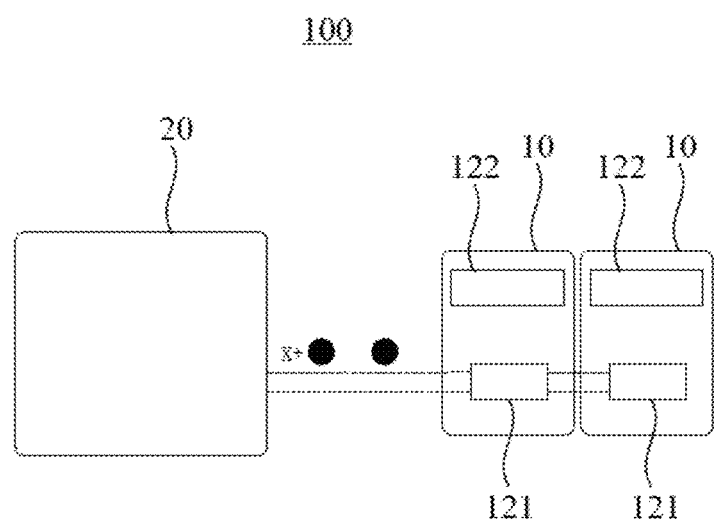
FIG. 3 is a schematic structural diagram of an integrated machine according to another embodiment of the present disclosure.

In some embodiments, referring to FIGS. 2 to 3, the at least two power conversion devices 10 are arranged at the same side of the transformer device 20, and alternate current wiring areas 122 of the at least two power conversion devices 10 are arranged in the same plane.

In an embodiment, the power conversion devices 10 are arranged at the same side of the transformer device 20, and side walls of the power conversion devices 10 are arranged in parallel and adjacent to each other. In addition, the alternate current wiring areas 122 of the power conversion devices 10 are arranged in the same plane. In this way, alternate current outputs of the power conversion devices 10 and the low-voltage side of the transformer device are electrically connected in parallel and current-converged in a shortest path, which can save materials and simplify a wiring structure.

Figure 4:
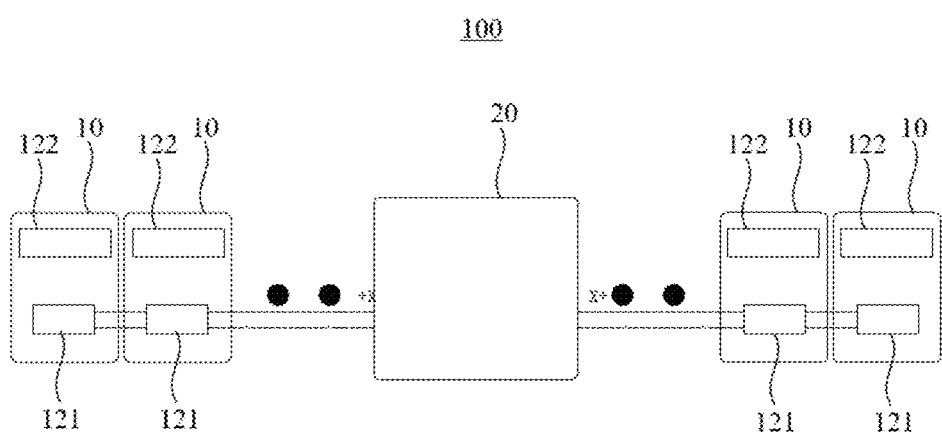
FIG. 4 is a schematic structural diagram of an integrated machine according to yet another embodiment of the present disclosure.
Figure 5:
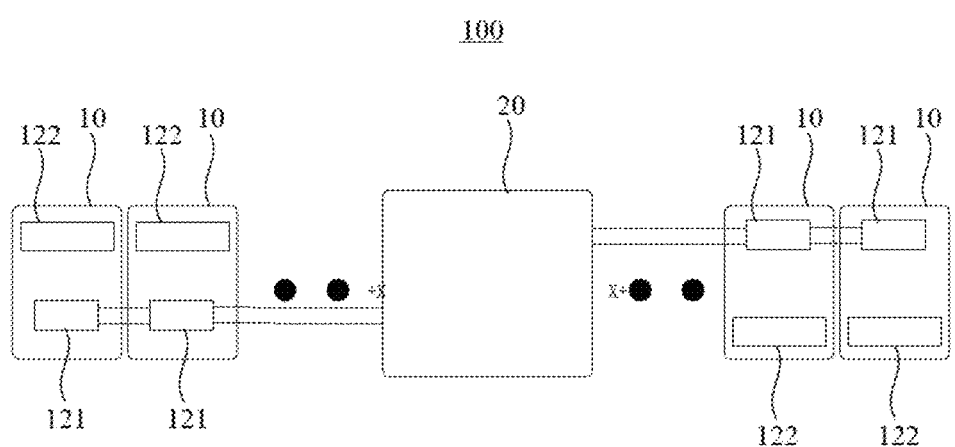
FIG. 5 is a schematic structural diagram of an integrated machine according to still yet another embodiment of the present disclosure.

In an embodiment, referring to FIGS. 4 to 5, the at least two power conversion devices 10 are arranged at different sides of the transformer device 20, and alternate current wiring areas 122 of the power conversion devices 10 arranged at the same side of the transformer device 20 are arranged in the same plane.

In a case that the quantity of the power conversion devices 10 is large, the power conversion devices 10 may be arranged at different sides of the transformer device 20. For each side, the side walls of the power conversion devices 10 at the same side of the transformer device 20 are arranged in parallel and adjacent to each other, and the alternate current wiring areas 122 of the power conversion devices 10 at the same side are arranged in the same plane.

In an embodiment, referring to FIGS. 4 to 5, the power conversion devices 10 are arranged at opposite sides of the transformer device 20. The alternate current wiring areas 122 of the power conversion devices 10 arranged at one side of the transformer device 20 are arranged in a first plane, and the alternate current wiring areas 122 of the power conversion devices 10 arranged at the other side of the transformer device 20 are arranged in a second plane, and the first plane and the second plane are coincident or in parallel.

In a case that the integrated machine 100 reaches a certain power, the same quantity of low-voltage electrical devices may be arranged at two sides of the medium voltage device. Side walls of the power conversion devices 10 at the same side are arranged in parallel and adjacent to each other, and alternate current wiring areas 122 of the power conversion devices at the same side are arranged in the same plane. Further, according to actual requirements, planes where the alternate current wiring areas 122 of the power conversion devices 10 at two sides of the transformer device 20 may be the same plane (as shown in FIG. 4) or different planes (as shown in FIG. 5).

In some embodiments, referring to FIGS. 4 to 5, quantities of power conversion devices 10 arranged at opposite sides of the transformer device 20 are equal to each other.

In some embodiments, by evenly distributing and symmetrically arranging the power conversion devices 10, the structure of the integrated machine 100 is balanced and easy to be managed.

The above is only some embodiments of the present disclosure, and does not limit the scope of the patent of the present disclosure. Any equivalent structural transformation made by using the contents of the specification and the drawings of the present disclosure, or direct/indirect application in other related technical fields, under the invention concept of the present disclosure, is included in the protection scope of the patent of the present disclosure.

The invention claimed is:

1. An integrated machine, comprising:
   a transformer device and a first power conversion device;
   wherein the first power conversion device, comprises:
   a housing; and
   a power converter arranged in the housing, wherein two ends, opposite to each other, of the power converter are respectively provided with a direct current wiring area and an alternate current wiring area;
   wherein two ends of the housing corresponding to the direct current wiring area and the alternate current wiring area each is provided with a movable door being capable of being opened and closed;
   wherein the first power conversion device is electrically connected with the transformer device through the alternate current wiring area, and a side wall of the first power conversion device faces the transformer device; and
   wherein the power converter has a length direction, the direct current wiring area and the alternate current wiring area are respectively arranged at two ends of the power converter in the length direction, and the first power conversion device is maintained at a transverse end of a second power conversion device.

2. The integrated machine according to claim 1, wherein there are at least two power conversion devices;
   wherein the alternate current wiring area of the power conversion device, adjacent to the transformer device, of the at least two power conversion devices is connected in parallel with the transformer device, and the alternate current wiring areas of two adjacent power conversion devices are connected in parallel with each other.

3. The integrated machine according to claim 2, wherein the at least two power conversion devices are arranged at a same side of the transformer device, and the alternate current wiring areas of the at least two power conversion devices are arranged in a same plane.

4. The integrated machine according to claim 2, wherein the at least two power conversion devices are arranged at different sides of the transformer device, and the alternate current wiring areas of the power conversion devices at a same side of the transformer device are arranged in a same plane.

5. The integrated machine according to claim 4, wherein the at least two power conversion devices are arranged at two opposite sides of the transformer device;
   wherein the alternate current wiring area of the power conversion device arranged at one side of the transformer device is in a first plane, and the alternate current wiring area of the power conversion device arranged at the other side of the transformer device is in a second plane, wherein the first plane and the second plane are coincident or in parallel.

6. The integrated machine according to claim 5, wherein quantities of the power conversion devices arranged at the two opposite sides of the transformer device are equal.

7. The integrated machine according to claim 1, wherein the movable door is rotatably connected with the housing; or,
   the movable door is slidably connected with the housing; or,
   the movable door is detachably connected with the housing.

8. The integrated machine according to claim 1, wherein a side wall of the housing is provided with a first threading hole for threading a wire connected with the alternate current wiring area; and/or,
   a bottom of the housing is provided with a second threading hole for threading a wire connected with the alternate current wiring area.

* * * * *